(12) United States Patent
Ide (10) Patent No.: US 8,129,989 B2
(45) Date of Patent: Mar. 6, 2012

(54) ELECTROMAGNETIC FIELD MEASURING APPARATUS AND METHOD THEREFOR

(75) Inventor: Takeshi Ide, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 231 days.

(21) Appl. No.: 12/472,336

(22) Filed: May 26, 2009

(65) Prior Publication Data

US 2009/0295379 A1 Dec. 3, 2009

(30) Foreign Application Priority Data

Jun. 3, 2008 (JP) .................................. 2008-145436
Apr. 14, 2009 (JP) .................................. 2009-098147

(51) Int. Cl.
*G01R 33/00* (2006.01)
(52) U.S. Cl. ........................................ 324/260; 324/244
(58) Field of Classification Search .................. 324/207, 324/207.2, 247, 72, 658
See application file for complete search history.

(56) References Cited

U.S. PATENT DOCUMENTS

| | | | |
|---|---|---|---|
| 6,242,911 B1 * | 6/2001 | Maschek | 324/247 |
| 6,456,070 B1 | 9/2002 | Kazama et al. | |
| 7,141,968 B2 * | 11/2006 | Hibbs et al. | 324/260 |
| 7,141,987 B2 * | 11/2006 | Hibbs et al. | 324/658 |

* cited by examiner

*Primary Examiner* — Huy Q Phan
*Assistant Examiner* — Alesa Allgood
(74) *Attorney, Agent, or Firm* — Fitzpatrick, Cella, Harper & Scinto (57) ABSTRACT

A plate conductor and at least three columnar conductors erected on the plate conductor are provided. At the same time when an electric field is measured by the plate conductor, two components of a magnetic field at the same measurement points as those at which the electric field is measured are measured by a loop formed by the plate conductor and the columnar conductors at the same time. As a result, three components of an electromagnetic field formed of one component of the electric field and two components of the magnetic field are measured at the same point, with high sensitivity, and at the same time.

8 Claims, 7 Drawing Sheets

FIG. 11

ELECTROMAGNETIC FIELD MEASURING APPARATUS AND METHOD THEREFOR

BACKGROUND OF THE INVENTION

1. Field of the Invention

The present invention relates to electromagnetic field measuring apparatus having an electromagnetic field measuring sensor, and a method therefor, for measuring an electromagnetic field developed by an electromagnetic noise radiated from an electronic device.

2. Description of the Related Art

Up to now, an electromagnetic field measuring sensor is adapted to measure an electromagnetic field that exists in the extreme vicinity of a conductor surface of an electronic device in a countermeasure against an electromagnetic interference (EMI) of the electronic device that radiates an electromagnetic noise. The electromagnetic field measuring sensor measures an electric field and a magnetic field at respective positions on the conductor surface, and obtains an electric field distribution and a magnetic field distribution over the entire conductor surface, thereby visualizing a location of a noise radiation source. In general, the noise radiation source is a location that functions as a wave source, a propagation path, and an antenna, and the location is specified to perform the efficiency of a countermeasure against the noise.

Figure 10:
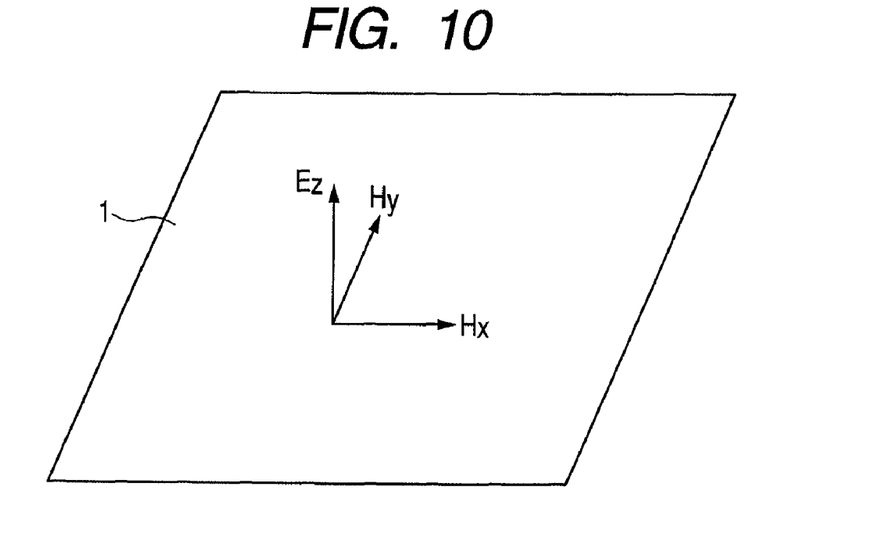
FIG. 10 is an explanatory diagram illustrating three components of an electromagnetic field on a conductor surface.

FIG. 10 illustrates an electromagnetic field component in a printed circuit board 1 of an electronic device. A vertical component is dominant in an electric field of the printed circuit board 1, and can be represented by Ez (V/m). The electric field component Ez is measured, thereby enabling a radiation source being a high impedance to be detected. Also, a horizontal component is dominant in a magnetic field of the printed circuit board 1, and can be represented by two components Hx and Hy (A/m) orthogonal to each other. Those two magnetic field components Hx and Hy are measured, thereby enabling a radiation source of a low impedance to be detected. That is, the radiation source in the printed circuit board 1 is required to measure those three components Ez, Hx, and Hy (three components of the electromagnetic field).

Up to now, those three components Ez, Hx, and Hy of the electromagnetic field are measured by sensors corresponding to the respective components. As an electric field sensor, a monopole antenna sensor has been generally known. The electric field component Ez in the vertical direction can be measured by the monopole antenna sensor. Also, as a magnetic field sensor, a loop antenna sensor has been known. A magnetic field component Hx (or Hy) in a direction perpendicular to a loop can be measured by the loop antenna sensor. The remaining magnetic field component Hy (or Hx) is measured by rotating the loop antenna sensor about a direction perpendicular to the printed circuit board 1 as an axis by 90 degrees. That is, it is general that the measurement of the electric field by the monopole antenna sensor and the measurement of the magnetic field by the loop antenna sensor are conducted, individually.

Figure 11:
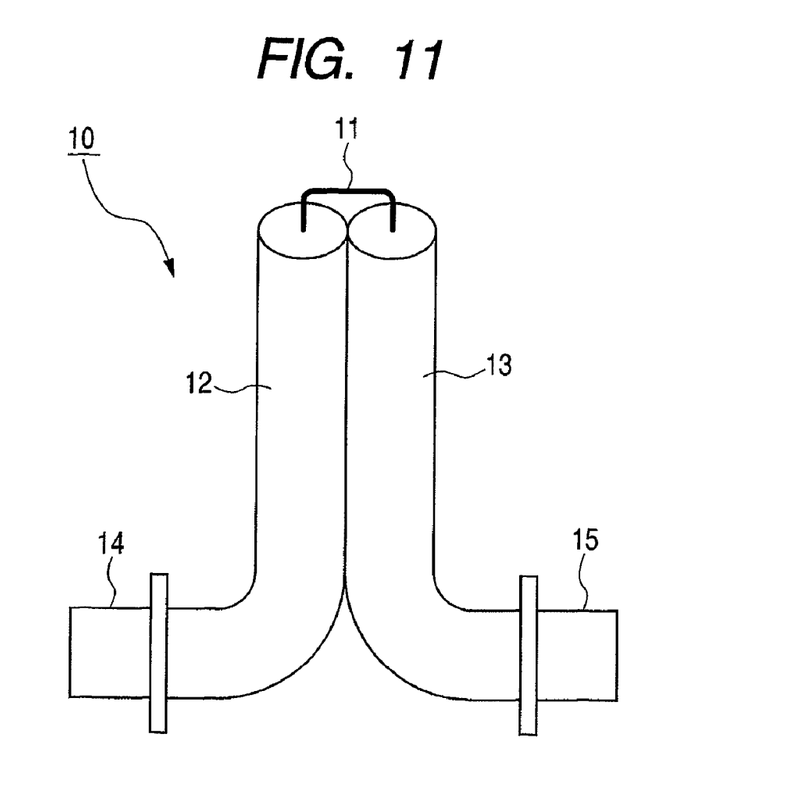
FIG. 11 is a schematic diagram illustrating a conventional electromagnetic field measuring sensor.

On the contrary, U.S. Pat. No. 6,456,070 discloses an electromagnetic field sensor that measures an electric field and a magnetic field at the same time. An electromagnetic field sensor 10 disclosed in U.S. Pat No. 6,456,070 is illustrated in FIG. 11. Referring to FIG. 11, reference numeral 12 and 13 denotes coaxial cables arranged in parallel to each other, which are connected to contact connectors 14 and 15, respectively. Ends of the coaxial cables 12 and 13 at sides opposite to the contact connectors 14 and 15 are connected to each other through a loop antenna 11 which is formed of an inner conductor of a coaxial cable. Current values that flow in the coaxial cables 12 and 13 are detected, respectively, and the detected values are calculated, thereby separating a current generated by the electric field and a current generated by the magnetic field from each other. With the above operation, two components of the electric field component Ez and the magnetic field component Hx (or Hy) are measured at the same time.

Also, the remaining magnetic field component Hy (or Hx) is measured by rotating the loop antenna sensor 11 about a direction perpendicular to the printed circuit board 1 as an axis by 90 degrees.

In recent years, with higher function of the electronic device, the radiation electromagnetic noises that mainly cause EMI have been changed from steady and cyclic noises to noises that temporally change. The noises that temporally change are directed to noises that change according to the operating state of a device such as a movable part or a data communication device. The change in the noises leads to a change of the electromagnetic field to be measured from a steady and cyclic electromagnetic field to an electromagnetic field that temporally fluctuates. That is, in order to observe a relationship between the electric field and the magnetic field which temporally change in synchronism with the operating state, the intensity of a current, the direction of the current, and so on, there is a need to measure three components of the electromagnetic field by an electromagnetic field measuring sensor at the same time.

However, the electromagnetic field sensor disclosed in U.S. Pat. No. 6,456,070 cannot measure two components Hx and Hy of the magnetic field at the same time. Accordingly, the electromagnetic field is caused to change while the electromagnetic field sensor is rotating by 90 degrees with the result that an appearance of the electromagnetic field that temporally fluctuates cannot be observed.

SUMMARY OF THE INVENTION

An object of the present invention is to provide an electromagnetic field measuring apparatus having an electromagnetic field measuring sensor which is capable of measuring three components of an electromagnetic field including one component of an electric field and two components of a magnetic field with a high sensitivity and at the same time, and an electromagnetic field measuring method therefor.

The electromagnetic field measuring apparatus according to one aspect of the present invention includes an electromagnetic field measuring sensor having a plate conductor and at least three columnar conductors erected on the plate conductor, a measuring device that detects currents induced in the at least three columnar conductors, independently, and a calculator that calculates a current excited by the plate conductor and a current excited by a loop formed by the plate conductor and arbitrary two of the at least three columnar conductors, separately, with respective current values detected by the measuring device.

Further, the electromagnetic field measuring method according to another aspect of the present invention includes: arranging an electromagnetic field measuring sensor including a plate conductor and at least three columnar conductors erected on the plate conductor in a vicinity of the electronic device; detecting currents induced in the at least three columnar conductors, independently; and calculating a current excited by the plate conductor and a current excited by a loop formed by the plate conductor and arbitrary two of the at least three columnar conductors with respective current values detected by a measuring device, separately, and calculating the electric field and the magnetic field radiated from the electronic device.

Further features of the present invention will become apparent from the following description of exemplary embodiments with reference to the attached drawings.

DESCRIPTION OF THE EMBODIMENTS

An electromagnetic field measuring apparatus having an electromagnetic field measuring sensor according to an embodiment of the present invention is described with reference to the drawings. Numeric values and materials of parts in the following description are for facilitation of understanding the present invention, and do not limit the present invention.

First Embodiment

Figure 1:
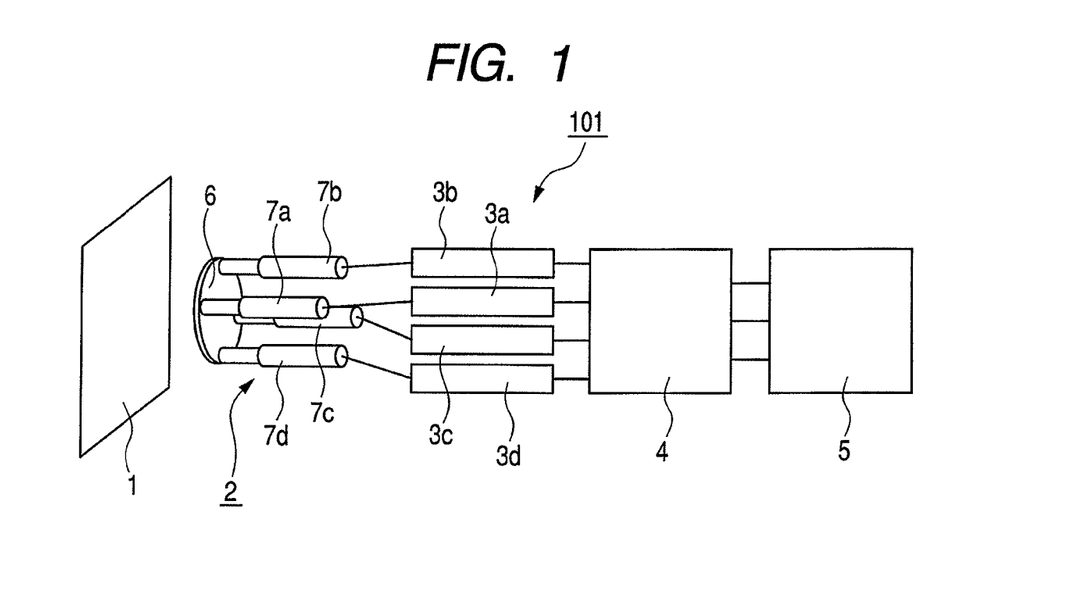
FIG. 1 is a schematic diagram illustrating an electromagnetic field measuring apparatus according to a first embodiment.

FIG. 1 is a schematic diagram illustrating a first embodiment of the present invention. An electromagnetic field measuring apparatus 101 according to the first embodiment includes an electromagnetic field measuring sensor 2, measuring devices 3a, 3b, 3c, and 3d, a calculator 4, and a display 5. The electromagnetic field measuring apparatus 101 measures an electromagnetic field radiated from a printed circuit board 1 or the like of an electronic device to be measured.

The electromagnetic field measuring sensor 2 is made up of a circular plate conductor 6, and four columnar conductors 7a, 7b, 7c, and 7d on an outer peripheral portion of the plate conductor 6 with a relationship of rotating symmetries through 90 degrees with each other. The respective columnar conductors 7a, 7b, 7c, and 7d are erected perpendicularly to the plate conductor 6, and electrically connected to the plate conductor 6. Also, ends of the respective columnar conductors 7a, 7b, 7c, and 7d opposite to the plate conductor 6 are output ends of the detection signal which are connected to measuring devices 3a, 3b, 3c, and 3d, independently. The respective measuring devices 3a, 3b, 3c, and 3d convert the amounts of currents flowing in the respective columnar conductors 7a, 7b, 7c, and 7d into voltages by using resistors for detection, respectively. The respective measuring devices 3a, 3b, 3c, and 3d are connected to the calculator 4. The calculator 4 calculates the amounts of currents that have been converted from the respective voltage values detected by the respective measuring devices 3a, 3b, 3c, and 3d, and obtain an electric field and a magnetic field at the respective points of the printed circuit board 1. An electric field distribution and a magnetic field distribution on the entire surface of the printed circuit board 1 from values of the respective points of the printed circuit board 1 are displayed on the display 5.

Figure 2:
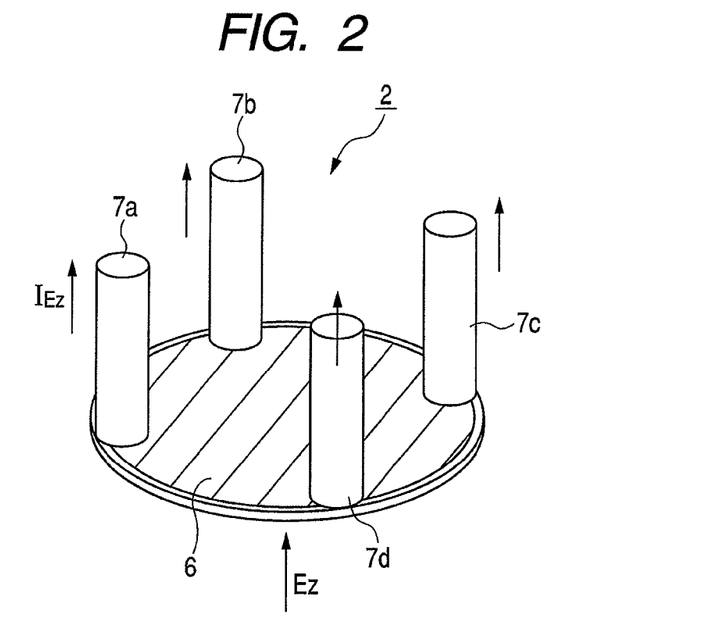
FIG. 2 is a schematic diagram for describing a flow of current induced by an electric field according to the first embodiment.

First, an electric field detecting method using the electromagnetic field measuring sensor 2 is described with reference to FIG. 2. FIG. 2 is a perspective view of the electromagnetic field measuring sensor 2. As illustrated in FIG. 1, the electromagnetic field measuring sensor 2 is disposed in the vicinity of the printed circuit board 1 of the electronic device, thereby capacitively coupling the printed circuit board 1 of the electronic device with the plate conductor 6. With the above configuration, a current corresponding to the magnitude of the capacitive coupling is induced in each of the columnar conductors 7a, 7b, 7c, and 7d of the electromagnetic field measuring sensor 2. That is, a current IEz flows in each of the columnar conductors 7a, 7b, 7c, and 7d upward as indicated by arrows due to an electric field component Ez perpendicularly to the printed circuit board 1. In this situation, the capacitive coupling is in proportion to an area of the plate conductor 6. Accordingly, an area contributing to the capacitive coupling is easily made larger than an area on the lower side of the loop antenna 11 in the conventional electromagnetic field sensor illustrated in FIG. 11, thereby enabling the sensitivity of the electric field detection to be improved.

Figure 3A:
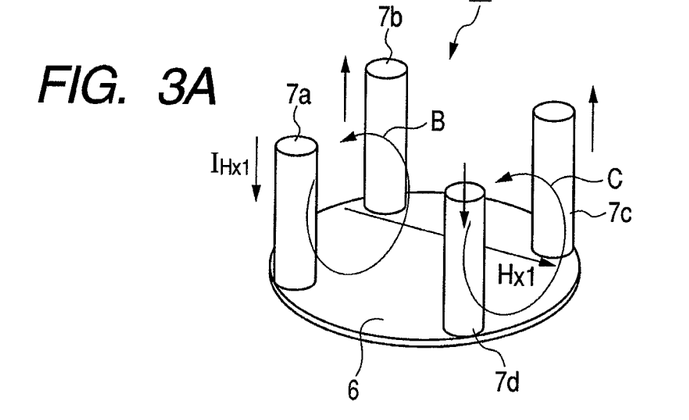
FIGS. 3A, 3B and 3C are schematic diagrams for describing a flow of current induced by a magnetic field according to the first embodiment, respectively.

Subsequently, a description is given of a method of detecting by the electromagnetic field measuring sensor 2 a magnetic field Hx1 being one component of two components of the magnetic field in the printed circuit board 1 with reference to FIG. 3A. FIG. 3A is a perspective view of the electromagnetic field measuring sensor 2. A loop B formed by the plate conductor 6 and the columnar conductors 7a and 7b, and a loop C formed by the plate conductor 6 and the columnar conductors 7c and 7d are inductively coupled to a magnetic field Hx1 indicated by arrows to allow a current to flow, respectively. A current IHx1 is excited in the columnar conductors 7b and 7c upward as indicated by arrows, and a current IHx1 is excited in the columnar conductors 7a and 7d downward as indicated by arrows.

Figure 3B:
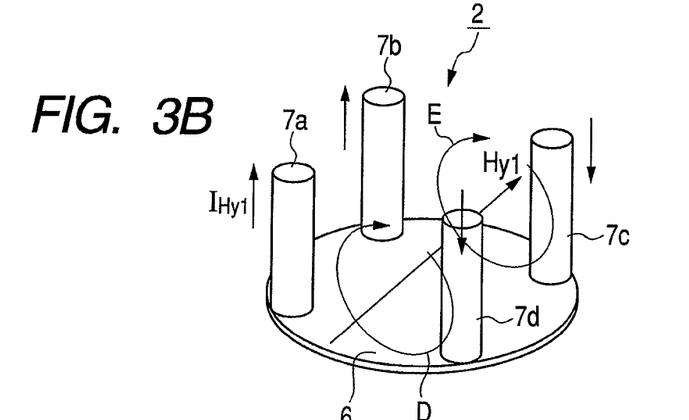

Subsequently, a description is given of a method of detecting by the electromagnetic field measuring sensor 2 a magnetic field Hy1 being one component of two components of the magnetic field in the printed circuit board 1 with reference to FIG. 3B. FIG. 3B is a perspective view of the electromagnetic field measuring sensor 2. A loop D formed by the plate conductor 6 and the columnar conductors 7a and 7d, and a loop E formed by the plate conductor 6 and the columnar conductors 7b and 7c are inductively coupled to a magnetic field Hy1 indicated by an arrow to allow a current to flow, respectively. A current IHy1 is excited in the columnar conductors 7a and 7b upward as indicated by arrows, and a current IHy1 is excited in the columnar conductors 7c and 7d downward as indicated by arrows.

Figure 3C:
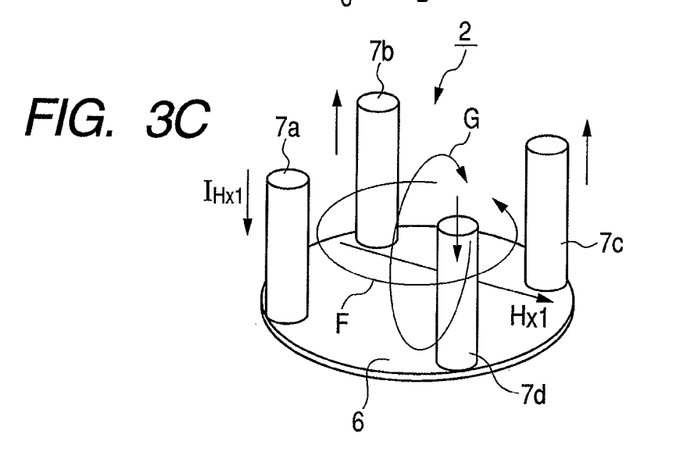

Further, the electromagnetic field measuring sensor 2 forms a loop F formed by the plate conductor 6 and the columnar conductors 7a and 7d, and a loop G formed by the plate conductor 6 and the columnar conductors 7b and 7c as illustrated in FIG. 3C. A current IHx1 is excited in a direction indicated by an arrow of each columnar conductor due to the magnetic field component Hx1 by the loops F and G. In this situation, the orientation of the current IHx1 is equal to that in FIG. 3A, and the current IHx1 becomes larger due to the loops F and G, to increase the sensitivity to the magnetic field component Hx1. Also, similarly, in the magnetic field component Hy1, the current IHy1 becomes larger due to the loops F and G, thereby enhancing the sensitivity to be increased. That is, multiple loops including not only the loops B, C, D, and E but also the loops F and G are used to increase the magnetic field detection sensitivity.

The columnar conductors 7a, 7b, 7c, and 7d are erected perpendicular to the plate conductor 6 with the results that the surfaces of the formed loops B to G are perpendicular to the plate conductor 6. With the above configuration, an influence of the magnetic field components other than the magnetic field components Hx1 and Hy1, in the direction perpendicular to the plate conductor 6 is reduced, and therefore the magnetic field detection sensitivity is enhanced.

Currents I1, I2, I3, and I4 obtained by combining IEz, IHx1, and IHy1 together flow in the respective columnar conductors 7a, 7b, 7c, and 7d due to the above capacitive coupling and the inductive coupling. The calculator 4 calculates the currents I1, I2, I3, and I4, and calculates the intensities of one component of the perpendicular electric field and two components of the horizontal magnetic field with respect to the printed circuit board 1.

The currents I1, I2, I3, and I4 flowing in the respective columnar conductors 7a, 7b, 7c, and 7d can be represented by (Expression 1), (Expression 2), (Expression 3), and (Expression 4).

$$I1 = IEz - IHx1 + IHy1 \quad \text{(Expression 1)}$$

$$I2 = IEz + IHx1 + IHy1 \quad \text{(Expression 2)}$$

$$I3 = IEz - IHx1 - IHy1 \quad \text{(Expression 3)}$$

$$I4 = IEz + IHx1 - IHy1 \quad \text{(Expression 4)}$$

From (Expression 1), (Expression 2), (Expression 3), and (Expression 4), the currents IEz, IHx, and IHy can be represented by (Expression 5), (Expression 6), and (Expression 7).

$$IEz = (I1 + I2 + I3 + I4)/4 \quad \text{(Expression 5)}$$

$$IHx1 = (-I1 + I2 + I3 - I4)/4 \quad \text{(Expression 6)}$$

$$IHy1 = (I1 + I2 - I3 - I4)/4 \quad \text{(Expression 7)}$$

The currents IEz, IHx1, and IHy1 are not electric field intensity or magnetic field intensity per se, and in order to obtain the absolute values of the electric field intensity and the magnetic field intensity, calculation must be made taking the magnetic permeability of the columnar conductors 7a, 7b, 7c, 7d and the plate conductor 6 as well as the loop areas into consideration. However, because the absolute values of the electric field intensity and the magnetic field intensity are in proportion to the currents IEz, IHx1, and IHy1, it is only necessary to find the relative values at respective points of the printed circuit board 1 in order to visualize the electric field distribution and the magnetic field distribution of the printed circuit board 1. Accordingly, in this embodiment, the currents IEx, IHx1, and IHy1 are merely detected.

Example 1

Figure 4:
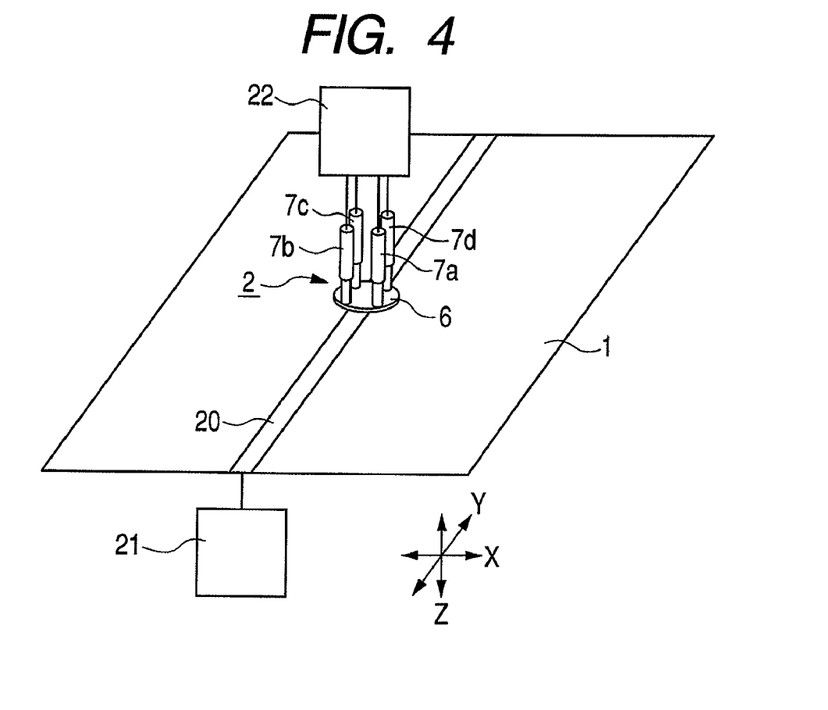
FIG. 4 is a schematic diagram illustrating an experimental device according to the first embodiment.

An experiment of the electromagnetic field measurement was executed by using the electromagnetic field measuring apparatus 101 according to the first embodiment illustrated in FIG. 1. FIG. 4 is a perspective view illustrating an appearance of the experiment. In FIG. 4, the same parts as those in FIG. 1 are denoted by identical symbols, and their description is omitted.

Referring to FIG. 4, the columnar conductors 7a, 7b, 7c, and 7d are erected perpendicular to the plate conductor 6 at four regular intervals in the circumference of the plate conductor 6. The plate conductor 6 is a circular copper plate that is 0.2 mm in thickness and 15 mm in diameter. The columnar conductors 7a, 7b, 7c and 7d were each formed of a semi-rigid coaxial cable made of copper which was 2.19 mm in the diameter of an outer conductor and 0.51 mm in the diameter of an inner conductor. A length of the columnar conductors 7a, 7b, 7c, and 7d is 100 mm, and each portion of the columnar conductors 7a, 7b, 7c, and 7d extending 5 mm from a leading end connected to the plate conductor 6 exposes the inner conductor. The measuring device 3, the calculator 4, and the display 5 were formed of an oscilloscope 22, and the computing process is executed by using the computing function of the oscilloscope 22.

As an object to be measured, there was used a microstripline 20 disposed on the printed circuit board 1 which is terminated, 300 mm in length, 3 mm in width, and 1.6 mm in thickness. It is assumed that the width direction of the microstripline 20 is x, the length direction is y, and the height direction is z. A sine wave (0 dBm) of 625 MHz being 5/4 wavelength resonance with respect to the size of the printed circuit board 1 was input from a function generator 21.

The plate conductor 6 of the electromagnetic field measuring sensor 2 was arranged at a position 10 mm in height from the microstripline 20, and the microstripline 20 was scanned with the plate conductor 6 along a y-direction to measure an electromagnetic field. The orientation of the electromagnetic field measuring sensor 2 was arranged in such a manner that the center line of the microstripline 20 passes between the columnar conductors 7a and 7b, and between the columnar conductors 7c and 7d. The currents I1, I2, I3, and I4 flowing in the respective columnar conductors 7a, 7b, 7c, and 7d, which have been detected by the oscilloscope 22, are calculated by the computing function of the oscilloscope 22 according to the above-mentioned Expression 1 to Expression 7 to calculate currents IEz, IHx1, and IHy1 at the respective scanning positions. The results are illustrated in FIG. 5.

Figure 5:
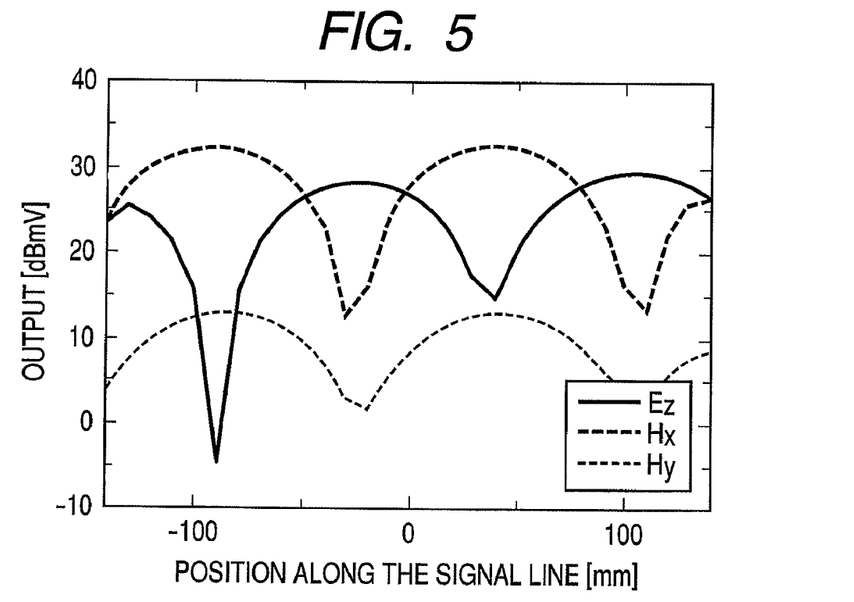
FIG. 5 is a graph illustrating measured results of an electromagnetic field measuring sensor according to Example 1.

An axis of abscissa in FIG. 5 is indicative of positions of the microstripline 20 in the longitudinal direction. Because the center of the microstripline of 300 mm in the longitudinal direction is 0, the position is ranged from −150 mm to 150 mm. The axis of ordinate is indicative of an output voltage corresponding to the respective electromagnetic field components. As understood from FIG. 5, the respective components Ez, Hx1, and Hy1 of the electromagnetic field at the respective scanning positions accurately represent the characteristics of the input signal being 5/4 wavelength resonance. That is, the respective components represent the electromagnetic field components corresponding to the standing wave of a 5/4 wavelength generated in the microstripline 20.

Figure 6:
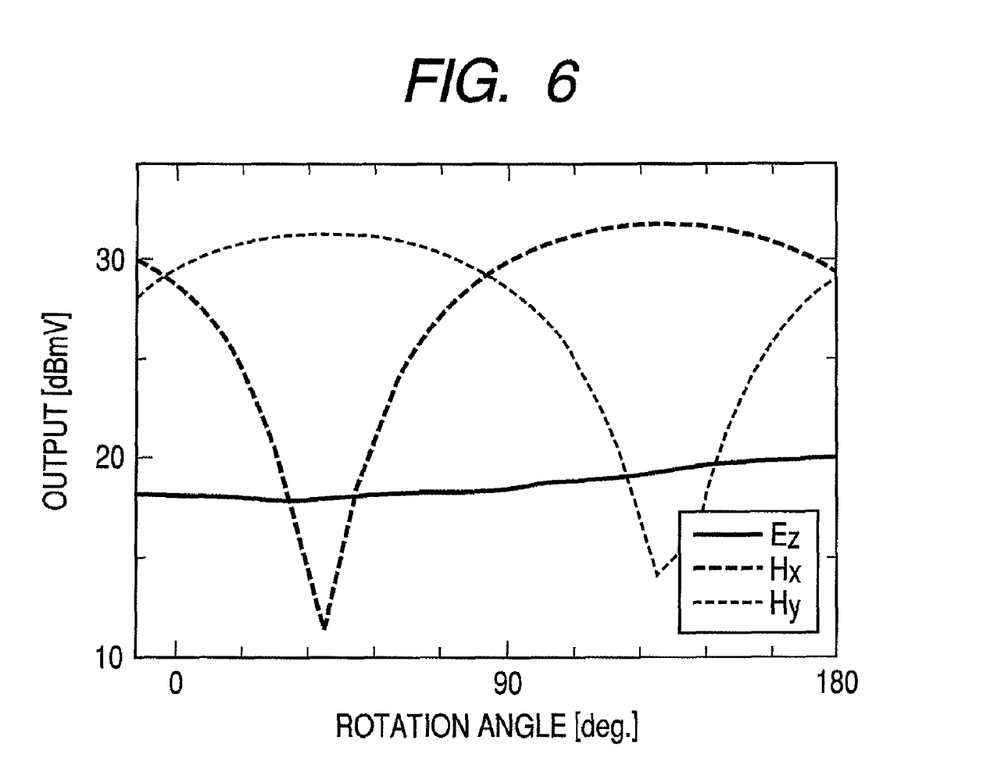
FIG. 6 is a graph illustrating the measured results of the electromagnetic field measuring sensor according to Example 1.

Subsequently, the electromagnetic field measuring sensor 2 was rotated about the perpendicular direction of the plate conductor 6 as an axis at the position of 50 mm where the magnetic field Hx1 had a peak in FIG. 5. The measured results at the time are illustrated in FIG. 6. It is found from FIG. 6 that the directivity of the vertical electric field one component Ez in the horizontal direction is substantially flat. Also, the magnetic field two components Hx1 and Hy1 periodically change by rotating the electromagnetic field measuring sensor 2. Accordingly, when the vectors of the measured magnetic field two components Hx1 and Hy1 are combined together, a constant value can be measured regardless of the rotating angle of the electromagnetic field measuring sensor 2. That is, even if the magnetic field component in any direction is dominant in the electromagnetic field measuring sensor 2, measurement is enabled with equal sensitivity. In order to execute measurement with the equal sensitivity even with the electric field component and the magnetic field component in all of directions, the plate conductor 6 is optimally circular, and it is preferable that the columnar conductors 7a, 7b, 7c, and 7d can be each formed of a conductor as thin as possible.

Example 2

For comparison of the electromagnetic field sensor in this embodiment with the conventional electromagnetic field sensor illustrated in FIG. 11 in performance, an electromagnetic field simulation was conducted. A simulation model is identical with the electromagnetic field measuring apparatus 101 illustrated in FIGS. 1 and 4 of the first embodiment, except that a length of the microstripline 20 is 200 mm. A sine wave of 193 MHz which resonates with ¼ wavelength with respect to the size of the printed circuit board 1 was input from the function generator 21. The model of the conventional electromagnetic field sensor illustrated in FIG. 11 was prepared so that the area of the loop being the magnetic field detection part was equal to each other.

Figure 7:
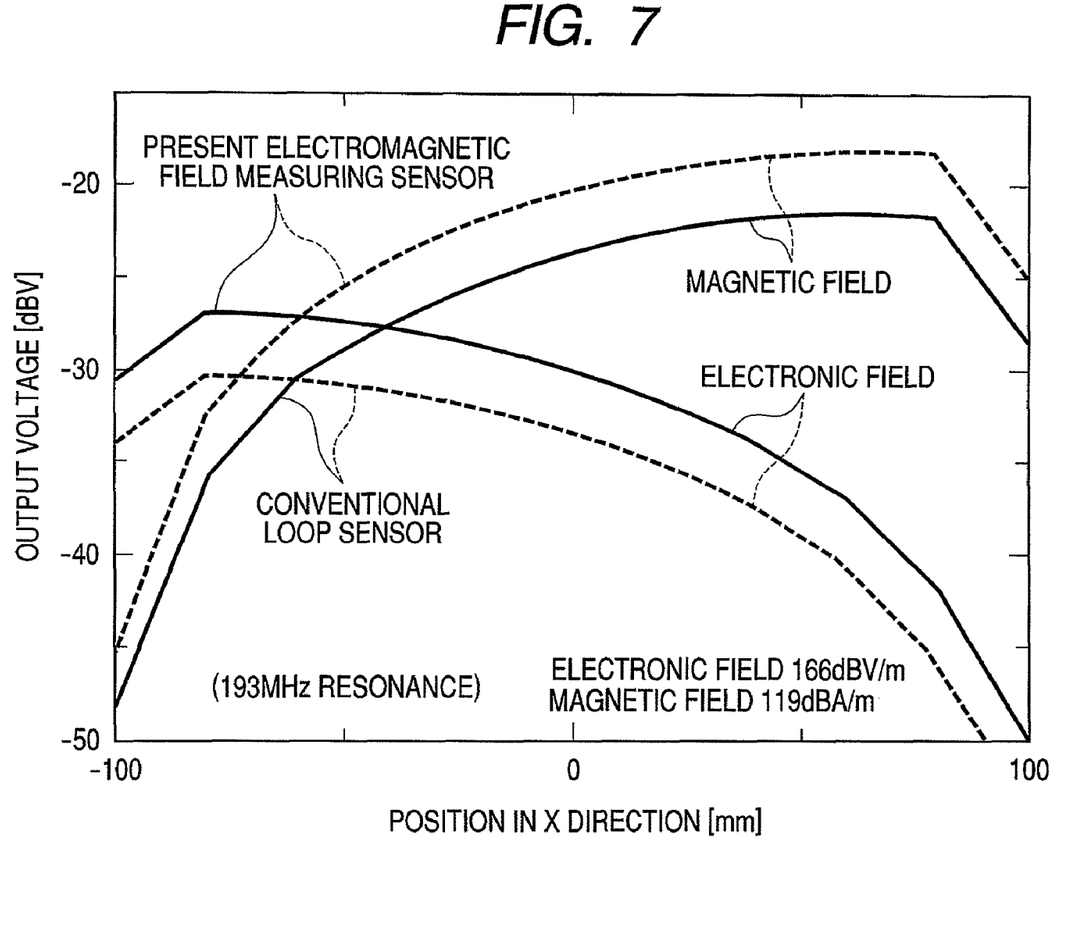
FIG. 7 is a graph illustrating a simulation result of an electromagnetic field measuring sensor according to Example 2.

The simulation results of the electromagnetic field sensor according to this embodiment and the conventional electromagnetic field sensor are illustrated in FIG. 7. The axis of abscissa of FIG. 7 is positions of the microstripline 20 in the longitudinal direction. Because the center of the microstripline 20 of 200 mm in the longitudinal direction is 0, the position is ranged from −100 mm to 100 mm. The axis of ordinate is indicative of an output voltage corresponding to the respective electromagnetic field components. The measured results with respect to the magnetic field indicate only the magnetic field component in a direction (x direction) that is in perpendicular to the longitudinal direction of the microstripline 20.

As is understood from FIG. 7, the magnetic field detection sensitivities at the respective positions of the microstripline 20 are such that the electromagnetic field sensor in this embodiment is higher by 3.4 dB at maximum. This is caused by an influence of multiple loops illustrated in FIG. 3C. The electric field detection sensitivity in the electromagnetic field sensor according to this embodiment is higher by 3.7 dB at maximum. The electric field detection sensitivity is improved because the plate conductor 6 being the detection part of the electric field is larger than that of the conventional loop type sensor 10 (FIG. 11).

Second Embodiment

Figure 8:
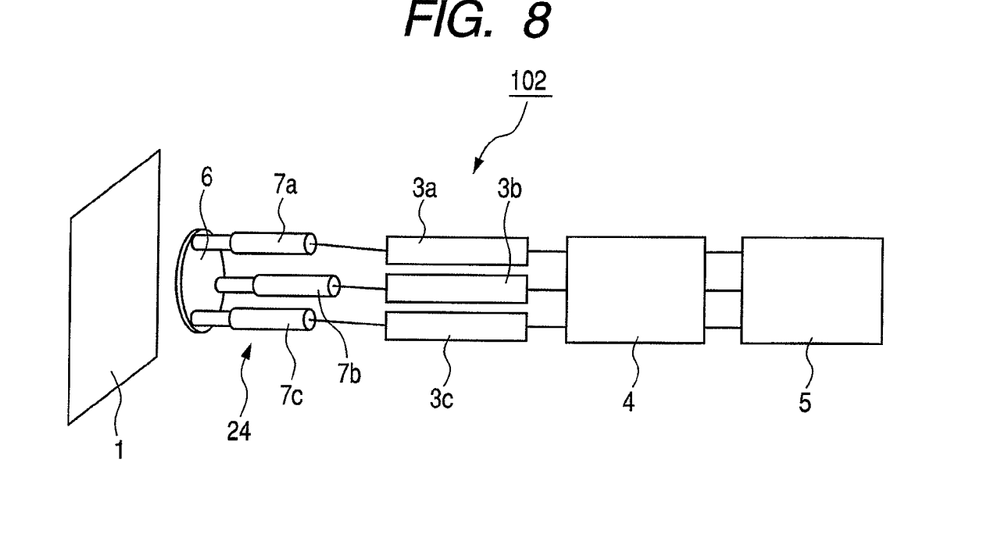
FIG. 8 is a schematic diagram illustrating an electromagnetic field measuring apparatus according to a second embodiment.

FIG. 8 is a schematic diagram illustrating an electromagnetic field measuring apparatus 102 according to a second embodiment of the present invention. In FIG. 8, the same parts as those in FIG. 1 are denoted by identical symbols, and their description is omitted. An electromagnetic field measuring sensor 24 illustrated in FIG. 8 is configured such that the number of columnar conductors is three as compared with the electromagnetic field measuring sensor 2 according to the first embodiment. Similarly, in this case, three components of the electromagnetic field can be measured at the same time.

Currents IEz, IHx1, and IHy1 are induced in the respective columnar conductors 7a, 7b, and 7c by the electromagnetic field to allow currents I1, I2, and I3 to flow. The current values I1, I2, and I3 can be represented by (Expression 8), (Expression 9), and (Expression 10).

$$I_1 = I_{Ez} - \frac{1}{\sqrt{2}} I_{Hx} + \left(1 + \frac{1}{\sqrt{2}}\right) I_{Hy} \quad \text{(Expression 8)}$$

$$I_2 = I_{Ez} + \sqrt{2}\, I_{Hx} \quad \text{(Expression 9)}$$

$$I_3 = I_{Ez} - \frac{1}{\sqrt{2}} I_{Hx} - \left(1 + \frac{1}{\sqrt{2}}\right) I_{Hy} \quad \text{(Expression 10)}$$

From (Expression 8), (Expression 9), and (Expression 10), the currents IEz, IHx, and IHy can be represented by (Expression 11), (Expression 12), and (Expression 13).

$$IEz=(I1+I2+I3) \quad \text{(Expression 11)}$$

$$IHx1=(-I1+2I2-I3) \quad \text{(Expression 12)}$$

$$IHy1=(I1-I3) \quad \text{(Expression 13)}$$

When the number of columnar conductors is three, the magnetic field detection sensitivity is lowered more than a case illustrated in FIG. 1 where the number of columnar conductors is four because the number of loops that detect the magnetic field is reduced. However, the number of columnar conductors and the number of measuring devices are sufficiently three, and hence it is possible to reduce the size and costs.

Third Embodiment

Figure 9:
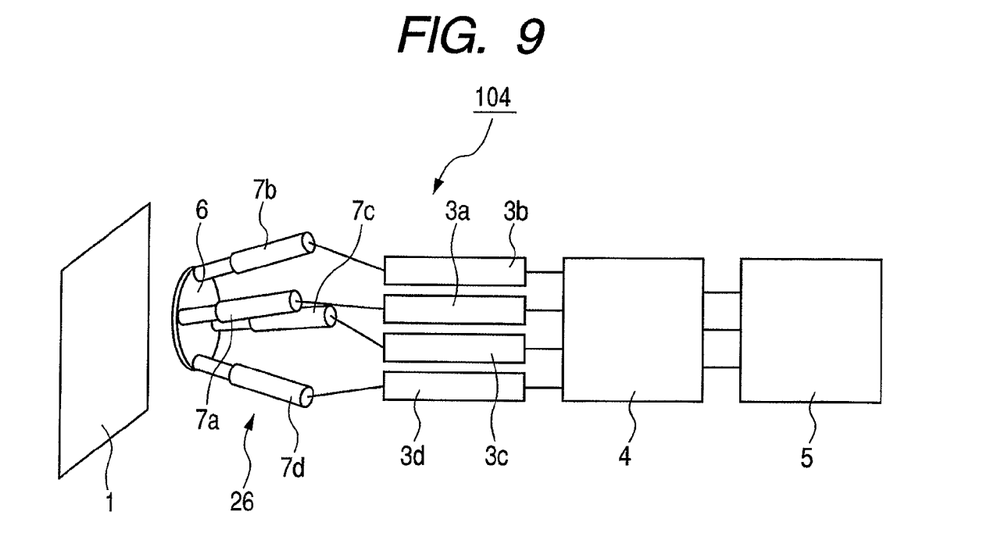
FIG. 9 is a schematic diagram illustrating an electromagnetic field measuring apparatus according to a third embodiment.

FIG. 9 is a schematic diagram illustrating an electromagnetic field measuring apparatus 104 according to a third embodiment of the present invention. In FIG. 9, the same parts as those in FIG. 1 are denoted by identical symbols, and their description is omitted. An electromagnetic field measuring sensor 26 illustrated in FIG. 9 is designed in such a manner that four columnar conductors 7a, 7b, 7c, and 7d are inclined outward as compared with the electromagnetic field measuring sensor 2 of the first embodiment.

The columnar conductors 7a, 7b, 7c, and 7d are inclined with respect to the plate conductor 6, whereby the area of the loop surface made up of the respective columnar conductors and the plate conductor is increased to improve the detection sensitivity of the magnetic field.

The number of columnar conductors is not limited if the number is equal to or more than three. When the respective columnar conductors are arranged at the regular intervals, the magnetic field intensity can be accurately measured regardless of the direction of the magnetic field. As the number of columnar conductors is larger, the number of loops that detect the magnetic field is larger, thereby increasing the detection sensitivity of the magnetic field. However, it is necessary that the magnetic field intensity and the number of measuring devices 3 be provided according to the number of columnar conductors, and the apparatus is upsized and the costs are increased. Accordingly, it is preferable that the number of columnar conductors be determined according to the electronic device for measurement and the intended purpose of the measurement.

Also, it is not always necessary that the plate conductor 6 be circular, but may be of a square or rectangular having four corners at which the columnar conductors 7a, 7b, 7c, and 7d are arranged. In the case of the rectangle, because the size of the loop for detecting the magnetic field is different between longer sides and shorter sides, the measured results are different according to the orientation of the magnetic field to be detected even with the same magnetic field intensity. Accordingly, such configuration is effective when the sensitivity of the magnetic field in a certain direction needs to be emphasized in advance.

The electromagnetic field measuring apparatus according to the present invention can measure the three components of the electromagnetic field formed of the electric field one component and the magnetic field two components with high sensitivity and at the same time because at least three columnar conductors erected on the plate conductor are provided. With the above-mentioned configuration, a relationship between the electric field and the magnetic field which change in synchronism with the operating state of the electronic device, and the intensity and direction of the current flowing on the substrate can be accurately observed. Therefore, a place being the radiation source of the radiation electromagnetic noise is visualized, thereby enabling the countermeasure against noises to be efficiently performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2008-145436, filed Jun. 3, 2008 and 2009-098147, filed Apr. 14, 2009, which are hereby incorporated by reference herein in their entirety.

What is claimed is:

1. An electromagnetic field measuring apparatus for measuring an electric field and a magnetic field radiated from an electronic device, comprising:
   an electromagnetic field measuring sensor including a plate conductor and at least three columnar conductors on the plate conductor, wherein the at least three columnar conductors are electrically connected to the plate conductor;
   measuring devices that detect currents induced in the at least three columnar conductors, independently; and
   a calculator that calculates intensities of the electric field and the magnetic field with respective current values detected by the measuring devices,
   wherein the calculator calculates a current excited by the plate conductor and a current excited by a loop formed by the plate conductor and an arbitrary two of the at least three columnar conductors, separately.

2. An electromagnetic field measuring apparatus according to claim 1, wherein the plate conductor is circular, and four of the columnar conductors are positioned at rotating symmetries with each other through 90 degrees.

3. An electromagnetic field measuring apparatus according to claim 1, wherein the at least three columnar conductors are erected perpendicular to the plate conductor.

4. An electromagnetic field measuring apparatus according to claim 1, wherein the at least three columnar conductors are erected at regular intervals on an outer peripheral portion of the plate conductor.

5. An electromagnetic field measuring apparatus according to claim 1, further comprising a display that displays results calculated by the calculator,
   wherein the display displays an intensity distribution of the electric field and an intensity distribution of the magnetic field which are radiated from the electronic device with the calculated values at respective measurement points of the electronic device.

6. An electromagnetic field measuring apparatus according to claim 1, wherein the electric field and the magnetic field are detected simultaneously in a same position.

7. An electromagnetic field measuring method for measuring an electric field and a magnetic field radiated from an electronic device, comprising:
   arranging an electromagnetic field measuring sensor including a plate conductor and at least three columnar conductors erected on the plate conductor in a vicinity of the electronic device, wherein the at least three columnar conductors are electrically connected to the plate conductor;
   detecting currents induced in the at least three columnar conductors, independently; and
   calculating a current excited by the plate conductor and a current excited by a loop formed by the plate conductor and an arbitrary two of the at least three columnar conductors with respective current values measured by a measuring device, separately, and calculating the electric field and the magnetic field radiated from the electronic device,
   wherein the electric field and the magnetic field are detected simultaneously in a same position.

8. An electromagnetic field measuring method according to claim 7, wherein an intensity distribution of the electric field and an intensity distribution of the magnetic field which are radiated from the electronic device are calculated with the current excited by the plate conductor and the current excited by the loop formed by the plate conductor and the arbitrary two of the at least three columnar conductors, which are calculated at a plurality of positions of the electronic device.

* * * * *